(12) United States Patent
Ide et al.

(10) Patent No.: US 10,181,540 B2
(45) Date of Patent: Jan. 15, 2019

(54) SOLAR CELL AND METHOD OF MANUFACTURING THE SAME

(75) Inventors: Daisuke Ide, Kobe (JP); Takahiro Mishima, Kobe (JP); Masato Shigematsu, Kobe (JP); Toshiaki Baba, Kobe (JP); Hiroyuki Mori, Kaiduka (JP); Mitsuaki Morigami, Izumiotsu (JP); Yuji Hishida, Kobe (JP); Hitoshi Sakata, Higashi-Osaka (JP); Ryo Goto, Kobe (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 718 days.

(21) Appl. No.: 13/557,255

(22) Filed: Jul. 25, 2012

(65) Prior Publication Data
US 2013/0186456 A1    Jul. 25, 2013

Related U.S. Application Data

(63) Continuation of application No. PCT/JP2011/051479, filed on Jan. 26, 2011.

(30) Foreign Application Priority Data

Jan. 26, 2010   (JP) .................................. 2010-014597

(51) Int. Cl.
*H01L 31/18*    (2006.01)
*H01L 31/078*   (2012.01)
(Continued)

(52) U.S. Cl.
CPC ................ *H01L 31/035281* (2013.01); *H01L 31/022441* (2013.01); *H01L 31/03529* (2013.01);
(Continued)

(58) Field of Classification Search
CPC ............. H01L 31/0747; H01L 31/0682; H01L 31/022441
See application file for complete search history.

(56) References Cited

U.S. PATENT DOCUMENTS 5,053,083 A * 10/1991 Sinton .......................... 136/256
7,339,110 B1    3/2008 Mulligan et al.
(Continued)

FOREIGN PATENT DOCUMENTS

CN    100401532 C    7/2008
CN    100431177 C    11/2008
(Continued)

OTHER PUBLICATIONS

Sinton R A et al.; "Simplified Backside-Contact Solar Cells"; IEEE Transactions on Electron Devices; vol. 37, No. 2, pp. 348-352 (Feb. 1990).
(Continued)

*Primary Examiner* — Shannon M Gardner
(74) *Attorney, Agent, or Firm* — Metrolexis Law Group, PLLC

(57) ABSTRACT

An aspect of the invention provides a solar cell that comprises a semiconductor substrate having a light-receiving surface and a rear surface; a first semiconductor layer having a first conductivity type; a second semiconductor layer having a second conductivity type, the first semiconductor layer and the second semiconductor layer being formed on the rear surface, and a trench formed in the rear surface, wherein the first semiconductor layer is formed on the rear surface in which the trench is not formed, and the second semiconductor layer is formed on a side surface of the trench in an arrangement direction in which the first semiconductor layer and the second semiconductor layer are alternately arranged and on a bottom surface of the trench.

13 Claims, 15 Drawing Sheets

(51) Int. Cl.
 *H01L 31/0224* (2006.01)
 *H01L 31/0352* (2006.01)
 *H01L 31/0747* (2012.01)

(52) U.S. Cl.
 CPC ........ *H01L 31/078* (2013.01); *H01L 31/0747* (2013.01); *H01L 31/1804* (2013.01); *H01L 31/1884* (2013.01); *Y02E 10/547* (2013.01); *Y02P 70/521* (2015.11)

(56) References Cited

U.S. PATENT DOCUMENTS

| | | | |
|---|---|---|---|
| 2005/0016585 A1 | 1/2005 | Munzer | |
| 2005/0062041 A1 | 3/2005 | Terakawa et al. | |
| 2007/0169808 A1 | 7/2007 | Kherani et al. | |
| 2008/0035198 A1 | 2/2008 | Teppe et al. | |
| 2008/0061293 A1* | 3/2008 | Ribeyron | H01L 31/022433 257/53 |
| 2009/0308438 A1* | 12/2009 | De Ceuster | H01L 31/022441 136/255 |
| 2010/0139745 A1* | 6/2010 | Cousins | H01L 31/022425 136/255 |
| 2010/0275993 A1* | 11/2010 | Kim | H01L 31/022425 136/257 |
| 2011/0000532 A1* | 1/2011 | Niira et al. | 136/255 |
| 2011/0053312 A1 | 3/2011 | Teppe et al. | |
| 2011/0073175 A1* | 3/2011 | Hilali | H01L 31/022441 136/256 |
| 2012/0103416 A1* | 5/2012 | Kwon | H01L 31/022425 136/256 |
| 2014/0087515 A1 | 3/2014 | Teppe et al. | |

FOREIGN PATENT DOCUMENTS

| | | |
|---|---|---|
| CN | 101401215 A | 4/2009 |
| CN | 100524832 C | 8/2009 |
| JP | 2005-101151 A | 4/2005 |
| JP | 2005-101240 A | 4/2005 |
| JP | 2005-510885 A | 4/2005 |
| JP | 2009-524916 A | 7/2009 |
| WO | 2009/096539 A1 | 8/2009 |
| WO | WO 2009/096539 A1 * | 8/2009 ............ H01L 31/06 |

OTHER PUBLICATIONS

Araujo G L et al.; "Back-contacted emitter GaAs solar cells"; Applied Physics Letters, vol. 56, No. 26, pp. 2633-2635 (Jun. 25, 1990).

* cited by examiner

SOLAR CELL AND METHOD OF MANUFACTURING THE SAME

CROSS REFERENCE TO RELATED APPLICATIONS

This application is a continuation application of International Application No. PCT/JP2011/051479, filed on Jan. 26, 2011, entitled "SOLAR CELL AND METHOD FOR PRODUCING SAME," which claims priority based on Article 4 of Patent Cooperation Treaty from prior Japanese Patent Applications No. 2010-014597, filed on Jan. 26, 2010, the entire contents of which are incorporated herein by reference.

BACKGROUND OF THE INVENTION

1. Field of the Invention

The invention relates to a back junction solar cell in which an n-type semiconductor layer and a p-type semiconductor layer are formed on a rear surface of a semiconductor substrate.

2. Description of Related Art

Solar cells directly convert sunlight energy, which is clean and unlimitedly supplied, into electric energy, and, thus, are expected as a new energy source.

Conventionally, a solar cell in which an n-type semiconductor layer and a p-type semiconductor layer are formed on a rear surface of a semiconductor substrate has been known, which is so-called a back junction solar cell (e.g., Patent Document 1). The back junction solar cell receives light through a light-receiving surface to generate carriers.

FIG. 1A is a cross-sectional view of a conventional back junction solar cell 100. As shown in FIG. 1(a), solar cell 100 includes n-type semiconductor layer 120 and p-type semiconductor layer 130, which are amorphous semiconductor layers, formed on rear surface 112 of semiconductor substrate 110. N-type semiconductor layer 120 and p-type semiconductor layer 130 are alternately arranged.

Patent Document 1: Published Japanese Translation of PCT International Application No. 2009-524916

SUMMARY OF THE INVENTION

In a back junction solar cell, carriers are taken only from a rear surface. Accordingly, a current density in the back junction solar cell becomes larger than that in a solar cell in which carriers are taken from a light-receiving surface and rear surface of a semiconductor substrate.

An aspect of the invention provides a solar cell that comprises a semiconductor substrate having a light-receiving surface and a rear surface; a first semiconductor layer having a first conductivity type; a second semiconductor layer having a second conductivity type, the first semiconductor layer and the second semiconductor layer being formed on the rear surface, and a trench formed in the rear surface, wherein the first semiconductor layer is formed on the rear surface in which the trench is not formed, and the second semiconductor layer is formed on a side surface of the trench in an arrangement direction in which the first semiconductor layer and the second semiconductor layer are alternately arranged and on a bottom surface of the trench.

In addition, a solar cell according to the invention includes: a semiconductor substrate; a first semiconductor layer formed on the semiconductor substrate; an insulation layer formed on the first semiconductor layer and formed to include an aperture exposing the first semiconductor layer; a second semiconductor layer arranged alternately with the first semiconductor layer on the semiconductor substrate and formed to cover the insulation layer; an underlying electrode formed on the first semiconductor layer and the second semiconductor layer and formed to include an isolation trench on the insulation layer, the isolation trench electrically isolating the first semiconductor layer and the second semiconductor layer from each other; and a collection electrode formed on the underlying electrode.

In addition, a method of manufacturing a solar cell according to the invention, includes the steps of: preparing a semiconductor substrate in which a first semiconductor layer and a second semiconductor layer arranged alternately with the first semiconductor layer are formed; forming an underlying electrode such that the underlying electrode covers the first semiconductor layer and the second semiconductor layer; forming an isolation trench separating the underlying electrode into a first portion connected to the first semiconductor layer and a second portion connected to the second semiconductor layer; and forming a collection electrode on each of the first portion and second portion of the underlying electrode by using a plating method.

DETAILED DESCRIPTION OF EMBODIMENTS

Figure 1A:
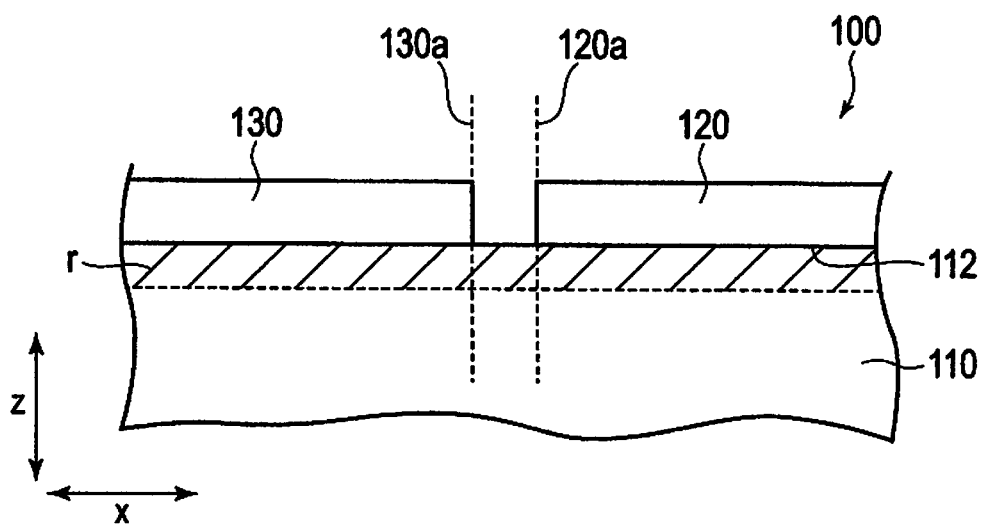
FIG. 1A is a cross-sectional view of conventional back junction solar cell 100.
Figure 1B:
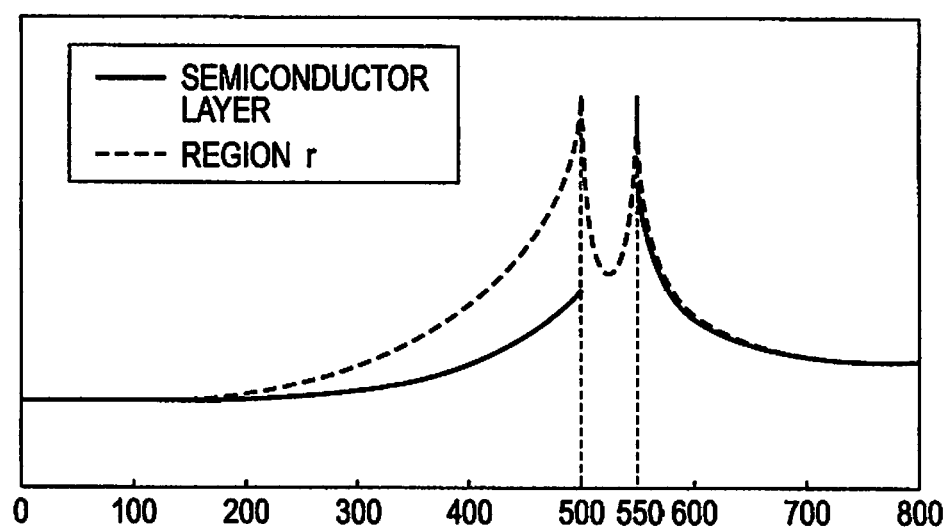
FIG. 1B is a graph showing a current density in solar cell 100.

First of all, in order to determine a magnitude of a current density of conventional back junction solar cell 100 shown in FIG. 1A, a current density is calculated by using a device simulator. Specifically, current densities of n-type semiconductor layer 120 and p-type semiconductor layer 130 and a current density of a region r from rear surface 112 of semiconductor substrate 110 to a depth of 0.05 μm in solar cell 100 are measured. It is assumed that the vertical axis is a current density and the horizontal axis is a length along arrangement direction x in which n-type semiconductor layer 120 and p-type semiconductor layer 130 are alternately arranged. As shown in FIG. 1A, an end portion of p-type semiconductor layer 130 is set to be positioned at 500 nm in arrangement direction x. An end portion of n-type semiconductor layer 120, the end portion adjacent to the end portion of p-type semiconductor layer 130, is set to be positioned at 550 nm in arrangement direction x. FIG. 1B shows the result.

As shown in FIG. 1B, it can be seen that the current density becomes larger in end region 120a of n-type semiconductor layer 120 and end region 130a of p-type semiconductor layer 130. Holes being carriers move to p-type semiconductor layer 130. The holes generated near n-type semiconductor layer 120 are concentrated to the end portion of p-type semiconductor layer 130 on rear surface 112. This likely causes the current density to be larger.

The temperature at the end portion of the semiconductor layer with a higher current density increases along with generated electricity as compared with other portions. This temperature increase results in deterioration in the semiconductor layer and time-related deterioration such that an end portion of the semiconductor layer comes off from a semiconductor substrate.

Subsequently, one example of solar cell 1 according to an embodiment is described by referring to the drawings. In the following description of the drawings, same or similar reference numerals are given to denote same or similar portions. Note that the drawings are merely schematically shown and proportions of sizes and the like are different from actual ones. Thus, specific sizes and the like should be judged by referring to the description below. In addition, there are of course included portions where relationships or percentages of sizes of the drawings are different with respect to one another.

(1) Schematic Configuration of Solar Cell 1A

Figure 2:
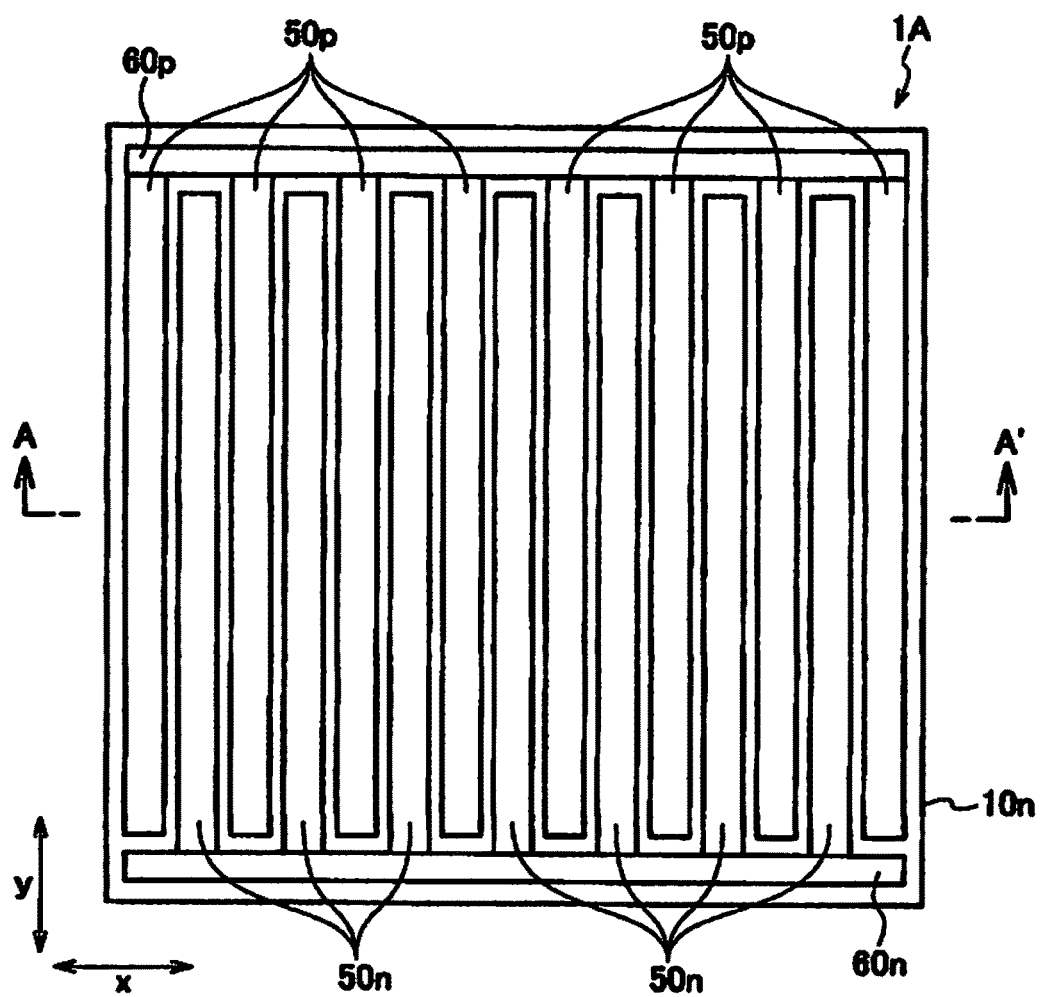
FIG. 2 is a plan view seen from rear surface 12 side of solar cell 1A according to an embodiment.
Figure 3:
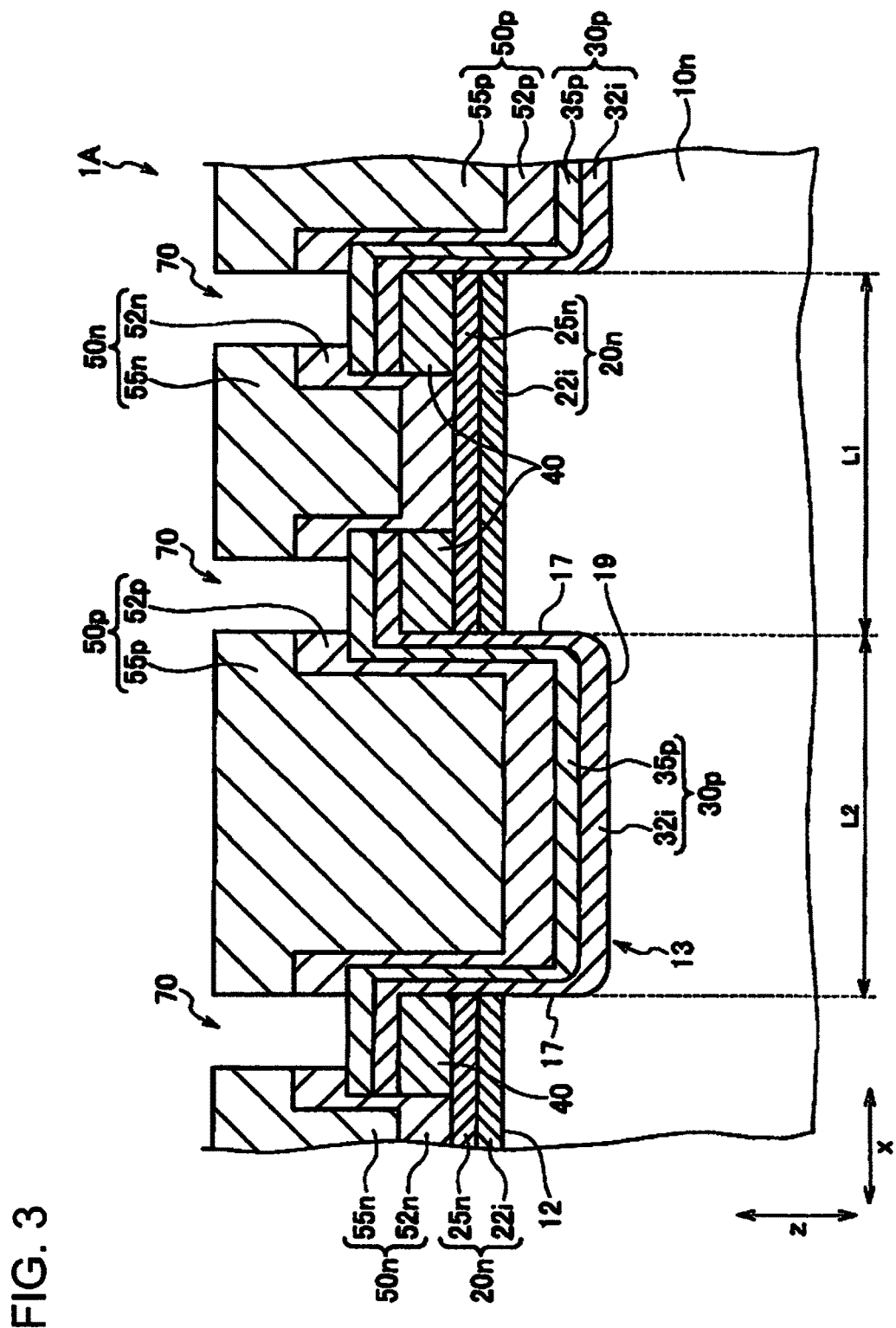
FIG. 3 is a cross-sectional view taken along the A-A' line in FIG. 2.

A schematic configuration of solar cell 1A according to an embodiment is described by referring to FIGS. 2 and 3. FIG. 2 is a plan view seen from rear surface 12 side of solar cell 1A according to an embodiment. FIG. 3 is a cross-sectional view seen from the A-A' line in FIG. 2.

As shown in FIGS. 2 and 3, solar cell 1A includes semiconductor substrate 10n, first semiconductor layer 20n, second semiconductor layer 30p, insulation layer 40, first electrode 50n, second electrode 50p, connection electrode 60n, and connection electrode 60p.

Semiconductor substrate 10n has light-receiving surface 11 receiving light and rear surface 12 provided on the opposite side from light-receiving surface 11. Semiconductor substrate 10n generates carriers by receiving light on light-receiving surface 11. The carriers mean holes and electrons which are generated by absorption of light into semiconductor substrate 10n.

As shown in FIG. 3, trench 13 is formed in rear surface 12 of semiconductor substrate 10n. Trench 13 has side surface 17 and bottom surface 19. In solar cell 1A, side surface 17 and bottom surface 19 are continuous to form an arc shape.

Semiconductor substrate 10n is a wafer shaped substrate capable of being made of a general semiconductor material including a crystalline semiconductor material such as a single crystal Si or polycrystalline Si having an n-type or p-type conductivity type or a compound semiconductor material such as GaAs or InP. Fine uneven portions may be formed on light-receiving surface 11 and rear surface 12 of semiconductor substrate 10n. Although not illustrated in the drawings, a structure (e.g., an electrode) blocking light from entering is not formed on light-receiving surface 11 of semiconductor substrate 10n. For this reason, semiconductor substrate 10n can receive light on entire light-receiving surface 11. Light-receiving surface 11 may be covered with a passivation layer. The passivation layer has a passivation property to inhibit re-coupling of the carriers. The passivation layer is a substantially intrinsic amorphous semiconductor layer which is formed in such a manner that, for example, a dopant is not added or a minute amount of dopant is added. In addition to this, an oxide film or a nitride film may be used. The description is made on assumption that semiconductor substrate 10n is an n-type single crystal silicon substrate in solar cell 1A. Accordingly, a conductivity type of semiconductor substrate 10n is an n-type. Thus, minority carriers are holes.

As shown in FIG. 3, first semiconductor layer 20n is formed on rear surface 12 of semiconductor substrate 10n. Specifically, first semiconductor layer 20n is formed on rear surface 12 in which trench 13 is not formed. Also, first semiconductor layer 20n is formed to have a longitudinal direction. This longitudinal direction is set as longitudinal direction y. First semiconductor layer 20n has a first conductivity type. In solar cell 1A, first semiconductor layer 20n has an n-type conductivity type.

As shown in FIG. 3, first semiconductor layer 20n includes i-type amorphous semiconductor layer 22i and n-type amorphous semiconductor layer 25n. I-type amorphous semiconductor layer 22i is formed on rear surface 12 of semiconductor substrate 10n. N-type amorphous semiconductor layer 25n is formed on i-type amorphous semiconductor layer 22i. With such configuration of n-type semiconductor substrate 10n, i-type amorphous semiconductor layer 22i, and n-type amorphous semiconductor layer 25n (so-called, BSF structure), the re-coupling of the minority carriers on the rear surface of semiconductor substrate 10n can be inhibited.

As shown in FIG. 3, second semiconductor layer 30p is formed on rear surface 12 of semiconductor substrate 10n. Specifically, second semiconductor layer 30p is formed on side surface 17 of trench 13 and bottom surface 19 of trench 13 in arrangement direction x. In solar cell 1A, second semiconductor layer 30p is also formed on insulation layer 40. Second semiconductor layer 30p is formed to cover the end portion of first semiconductor layer 20n. Also, second semiconductor layer 30p is formed along longitudinal direction y. Second semiconductor layer 30p has a second conductivity type. In solar cell 1A, second semiconductor layer 30p has a p-type conductivity type. Accordingly, semiconductor substrate 10n and second semiconductor layer 30p form a p-n junction.

As shown in FIG. 3, second semiconductor layer 30p includes i-type amorphous semiconductor layer 32i and p-type amorphous semiconductor layer 35p. I-type amorphous semiconductor layer 32i is formed on rear surface 12 of semiconductor substrate 10n. Accordingly, the junction between second semiconductor layer 30p and side surface 17 and the junction between second semiconductor layer 30p and bottom surface 19 are hetero-junctions. P-type amorphous semiconductor layer 35p is formed on i-type amorphous semiconductor layer 32i. With the configuration of n-type semiconductor substrate 10n, i-type amorphous semiconductor layer 32i, and p-type amorphous semiconductor layer 35p, the property of the p-n junction can be improved.

As shown in FIG. 3, first semiconductor layer 20n and second semiconductor layer 30p are alternately arranged along arrangement direction x. In solar cell 1A, width L2 of second semiconductor layer 30p formed on rear surface 12 in arrangement direction x is preferably longer than width L1 of first semiconductor layer 20n formed on rear surface 12 in arrangement direction x. With this, a series resistance can be lowered and thus a fill factor of the solar cell can be further reduced. Note that arrangement direction x and longitudinal direction y are perpendicular to each other.

First semiconductor layer 20n and second semiconductor layer 30p are in contact with each other on rear surface 12. Specifically, first semiconductor layer 20n and second semiconductor layer 30p are in contact with each other on a boundary between rear surface 12 in which trench 13 is not formed and trench 13. With this, a junction area between the semiconductor substrate and the semiconductor layer can be maximized, so that the rear surface of semiconductor substrate 10n can be effectively passivated. As a result, effectiveness of generating electricity can be improved.

Each of i-type amorphous semiconductor layer 22i, i-type amorphous semiconductor layer 32i, n-type amorphous semiconductor layer 25n, and p-type amorphous semiconductor layer 35p can include an amorphous semiconductor containing hydrogen and silicon. An example of such amorphous semiconductor includes an amorphous silicon, amorphous silicon carbide, or amorphous silicon germanium. In addition to this, other amorphous semiconductors may be used. Each of i-type amorphous semiconductor layer 22i, i-type amorphous semiconductor layer 32i, n-type amorphous semiconductor layer 25n, and p-type amorphous semiconductor layer 35p may include one kind of amorphous semiconductor. Each of i-type amorphous semiconductor layer 22i, i-type amorphous semiconductor layer 32i, n-type amorphous semiconductor layer 25n, and p-type amorphous semiconductor layer 35p may include a combination of two or more kinds of amorphous semiconductors.

Insulation layer 40 has an insulation property. Insulation layer 40 is formed on first semiconductor layer 20n. As insulation layer 40, aluminum nitride, silicon nitride, or silicon oxide may be used.

First electrode 50n is electrically connected to first semiconductor layer 20n. As shown in FIG. 2, first electrode 50n is formed along longitudinal direction y. First electrode 50n preferably includes transparent electrode layer 52n and collection electrode 55n. Transparent electrode layer 52n is formed on first semiconductor layer 20n. Specifically, transparent electrode layer 52n is formed in a state of being held between insulation layers 40 in arrangement direction x. Also, transparent electrode layer 52n is formed on second semiconductor layer 30p formed on insulation layer 40. Transparent electrode layer 52n is formed of a conductive material having translucency. As transparent electrode layer 52n, indium oxide tin, tin oxide, or zinc oxide may be used. Collection electrode 55n is formed on transparent electrode layer 52n. Collection electrode 55n may be formed using a resin-type conductive paste having a resin material as binder and conductive particles such as silver particles as fillers or using silver for the sputtering method. Besides, silver, nickel, copper or the like may be formed as an underlying metal by using a sputtering method, and thereafter copper or the like may be formed by the plating method.

Second electrode 50p is electrically connected to second semiconductor layer 30p. As shown in FIG. 2, second electrode 50p is formed along longitudinal direction y. Second electrode 50p preferably includes transparent electrode layer 52p and collection electrode 55p. Transparent electrode layer 52p is formed on second semiconductor layer 30p. Collection electrode 55p is formed on transparent electrode layer 52p. Transparent electrode layer 52p and collection electrode 55p may respectively use materials same as those of transparent electrode layer 52n and collection electrode 55n.

First electrode 50n and second electrode 50p collect carriers generated by receiving light. First electrode 50n and second electrode 50p are isolated by isolation trench 70 from each other in order to prevent a short circuit. Isolation trench 70 is provided in transparent electrode 52. Isolation trench 70 is provided in transparent electrode 52 formed on second semiconductor layer 30p formed on insulation layer 40. Accordingly, the bottom of isolation trench 70 is second semiconductor layer 30p. Second semiconductor layer 30p protects insulation layer 40 at the bottom of isolation trench 70. With this, second semiconductor layer 30p protects the junction between first semiconductor layer 20n and second semiconductor substrate 10n. Isolation trench 70 is formed along longitudinal direction y. Note that second semiconductor layer 30p has a p-type, which means that it has a low conductivity. For this reason, a leak between first electrode 50n and second electrode 50p via second semiconductor layer 30p is extremely small.

Connection electrode 60n is electrically connected to first electrodes 50n. Connection electrode 60p is electrically connected to second electrodes 50p. Connection electrode 60n and connection electrode 60p further collect photosynthesized carriers collected by first electrodes 50n and second electrodes 50p.

(2) Schematic Configuration of Solar Cell 1B

Figure 4:
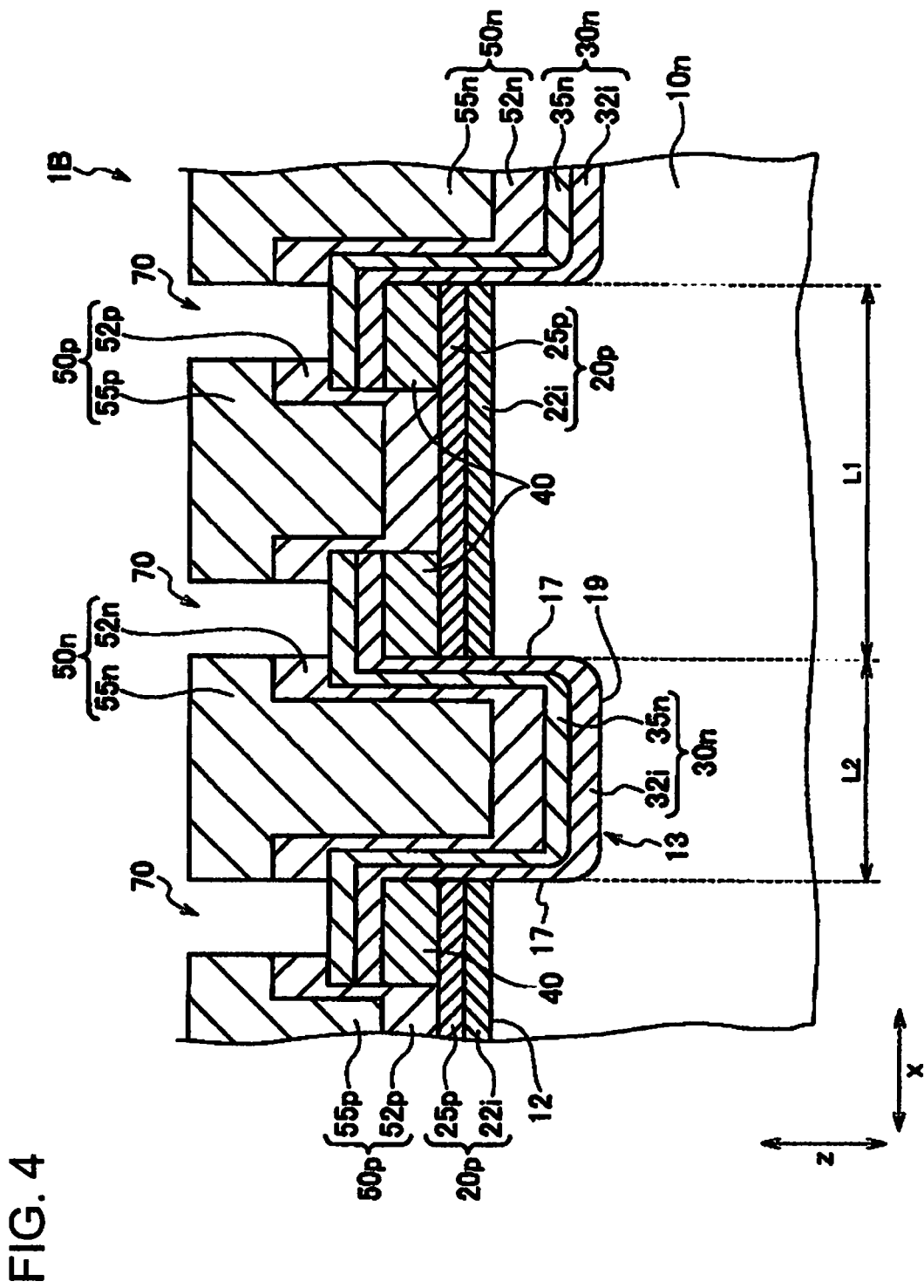
FIG. 4 is a cross sectional view taken along vertical direction z vertical to arrangement direction x and longitudinal direction y and arrangement direction x of solar cell 1B according to the embodiment.

A schematic configuration of solar cell 1B according to the embodiment is described by referring to FIG. 4. The description duplicated with that of solar cell 1A is omitted below. In other words, portions different from those of solar cell 1A are mainly described. FIG. 4 is a cross-sectional view taken along vertical direction z vertical to arrangement direction x and longitudinal direction y and arrangement direction x of solar cell 1B according to the embodiment.

As shown in FIG. 4, first semiconductor layer 20p is formed on rear surface 12 of semiconductor substrate 10n. Specifically, first semiconductor layer 20p is formed on rear surface 12 in which trench 13 is not formed. Also, first semiconductor layer 20p is formed along longitudinal direction y. In solar cell 1B, first semiconductor layer 20p has a p-type conductivity type. Accordingly, the conductivity type of semiconductor substrate 10n is different from that of first semiconductor layer 20p. Accordingly, semiconductor substrate 10n and first semiconductor layer 20p form a p-n junction.

As shown in FIG. 4, first semiconductor layer 20p includes i-type amorphous semiconductor layer 22i and p-type amorphous semiconductor layer 25p. I-type amorphous semiconductor layer 22i is formed on rear surface 12 of semiconductor substrate 10n. The p-type amorphous semiconductor layer 25p is formed on i-type amorphous semiconductor layer 22i.

As shown in FIG. 4, second semiconductor layer 30n is formed on rear surface 12 of semiconductor substrate 10n. Specifically, second semiconductor layer 30n is formed on side surface 17 of trench 13 and bottom surface 19 of trench 13 in arrangement direction x. In solar cell 1B, second semiconductor layer 30n is also formed on insulation layer 40. Second semiconductor layer 30n is formed to cover an end portion of semiconductor layer 20p. Also, second semiconductor layer 30n is formed along longitudinal direction y. In solar cell 1B, second semiconductor layer 30n has an n-type conductivity type. Accordingly, the conductivity type of semiconductor substrate 10n is same as that of second semiconductor layer 30n.

As shown in FIG. 4, second semiconductor layer 30n includes i-type amorphous semiconductor layer 32i and n-type amorphous semiconductor layer 35n. I-type amorphous semiconductor layer 32i is formed on rear surface 12 of semiconductor substrate 10n. The n-type amorphous semiconductor layer 35n is formed on i-type amorphous semiconductor layer 32i.

As shown in FIG. 4, in solar cell 1B, width L1 of first semiconductor layer 20p formed on rear surface 12 in arrangement direction x is longer than width L2 of second semiconductor layer 30n formed on rear surface 12 in arrangement direction x. In other words, width L2 is shorter than width L1.

(3) Schematic Configuration of Solar Cell 1C

Figure 5:
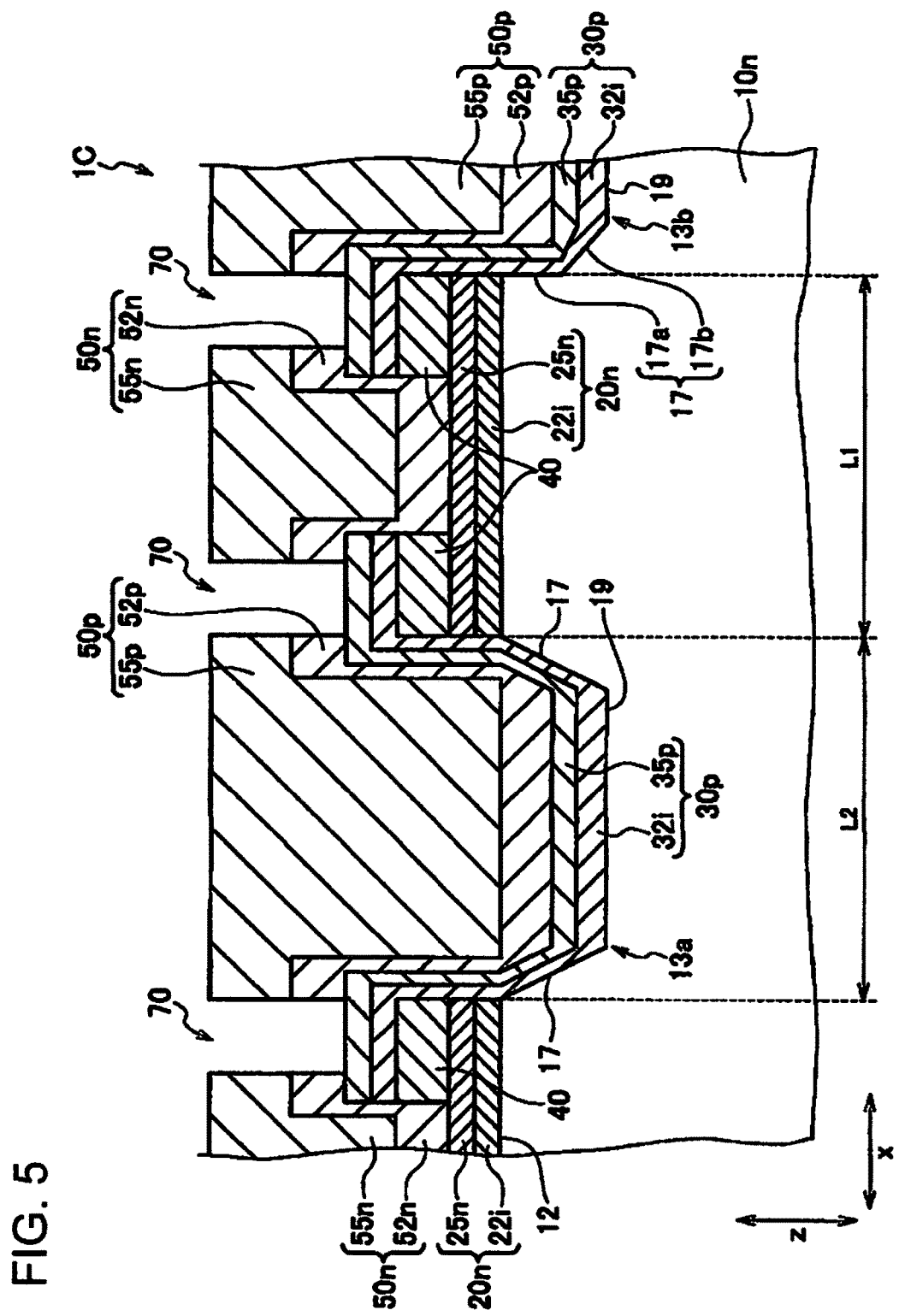
FIG. 5 is a cross-sectional view taken along vertical direction z vertical to arrangement direction x and longitudinal direction y and arrangement direction x of solar cell 1C according to the embodiment.

A schematic configuration of solar cell 1C is described by referring to FIG. 5. The description duplicated with that of solar cell 1A is omitted below. In other words, portions different from those of solar cell 1A are mainly described. FIG. 5 is a cross-sectional view taken along vertical direction z vertical to arrangement direction x and longitudinal direction y and arrangement direction x of solar cell 1C according to the embodiment.

As shown in FIG. 5, trench 13a and trench 13b are formed in rear surface 12 of semiconductor substrate 10n. Trench 13a has side surface 17 and bottom surface 19. Side surface 17 is included to be continuous with bottom surface 19. In solar cell 1C, side surface 17 and bottom surface 19 are continuous to form an angle therebetween. However, side surface 17 and bottom surface 19 may be continuous to form an arc shape.

Trench 13b has side surface 17 and bottom surface 19. Side surface 17 includes side surface 17a and side surface 17b. Side surface 17a and side surface 17b are continuous to form an angle therebetween. However, side surface 17a and side surface 17b may be continuous to form an arc shape. Side surface 17b and bottom surface 19 are continuous to form an angle therebetween. However, side surface 17b and bottom surface 19 may be continuous to from an arc shape.

In solar cell 1C, trench 13a and trench 13b are formed in rear surface 12. However, only trench 13a may be formed in rear surface 12. Or, only trench 13b may be formed in rear surface 12.

(4) Method of Manufacturing Solar Cell 1A

Figure 6:
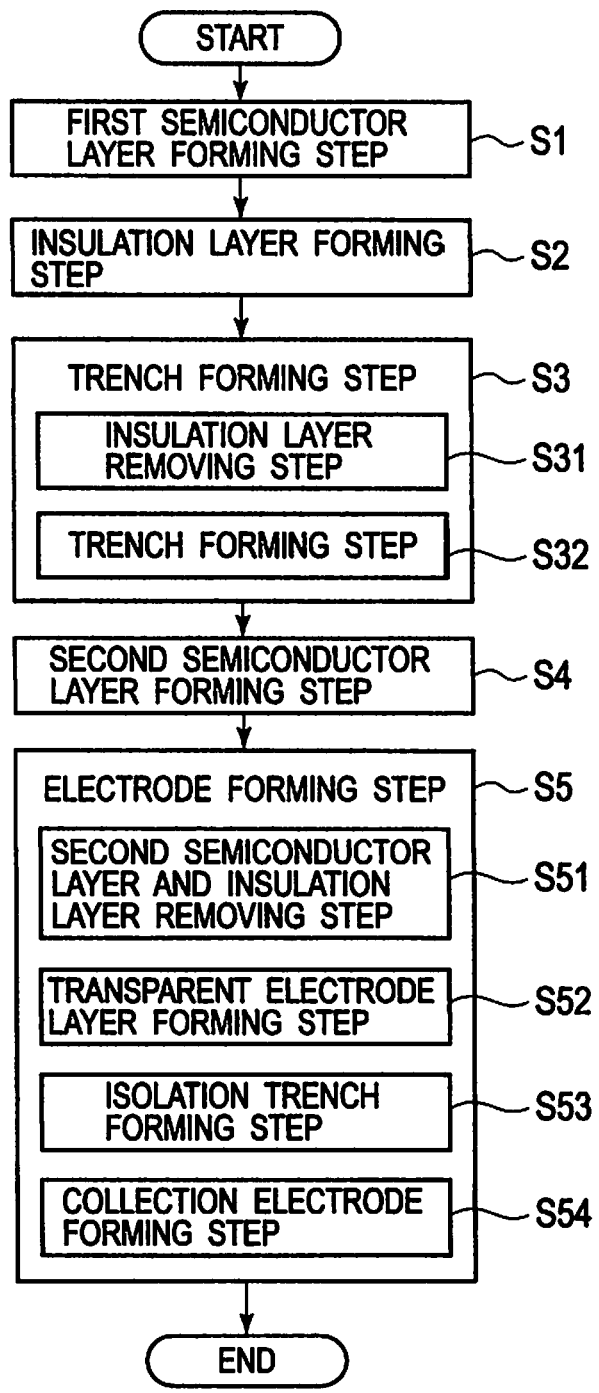
FIG. 6 is a flowchart for illustrating a method of manufacturing solar cell 1A according to the embodiment.

A method of manufacturing solar cell 1A according to the embodiment is described by referring to FIGS. 6 to 13. FIG. 6 is a flowchart for illustrating a method of manufacturing solar cell 1A, according to the embodiment. FIGS. 7 to 13 are views, each for illustrating a method of manufacturing solar cell 1A according to the embodiment.

As shown in FIG. 6, the method of manufacturing solar cell 1A includes steps S1 to S5.

Step S1 is a step of forming first semiconductor layer 20n having a first conductivity type on rear surface 12 of semiconductor substrate 10n. Firstly, semiconductor substrate 10n is prepared. To remove particles on the surface of semiconductor substrate 10n, semiconductor substrate 10n was subjected to etching with an acid or alkali solution. On rear surface 12 of prepared semiconductor substrate 10n, i-type amorphous semiconductor layer 22i is formed. On formed i-type amorphous semiconductor layer 22i, n-type amorphous semiconductor layer 25n is formed. I-type amorphous semiconductor layer 22i and n-type amorphous semiconductor layer 25n are formed by, for example, a chemical vapor deposition method (CVD method). With this step S1, first semiconductor layer 20n is formed on rear surface 12.

Figure 7:
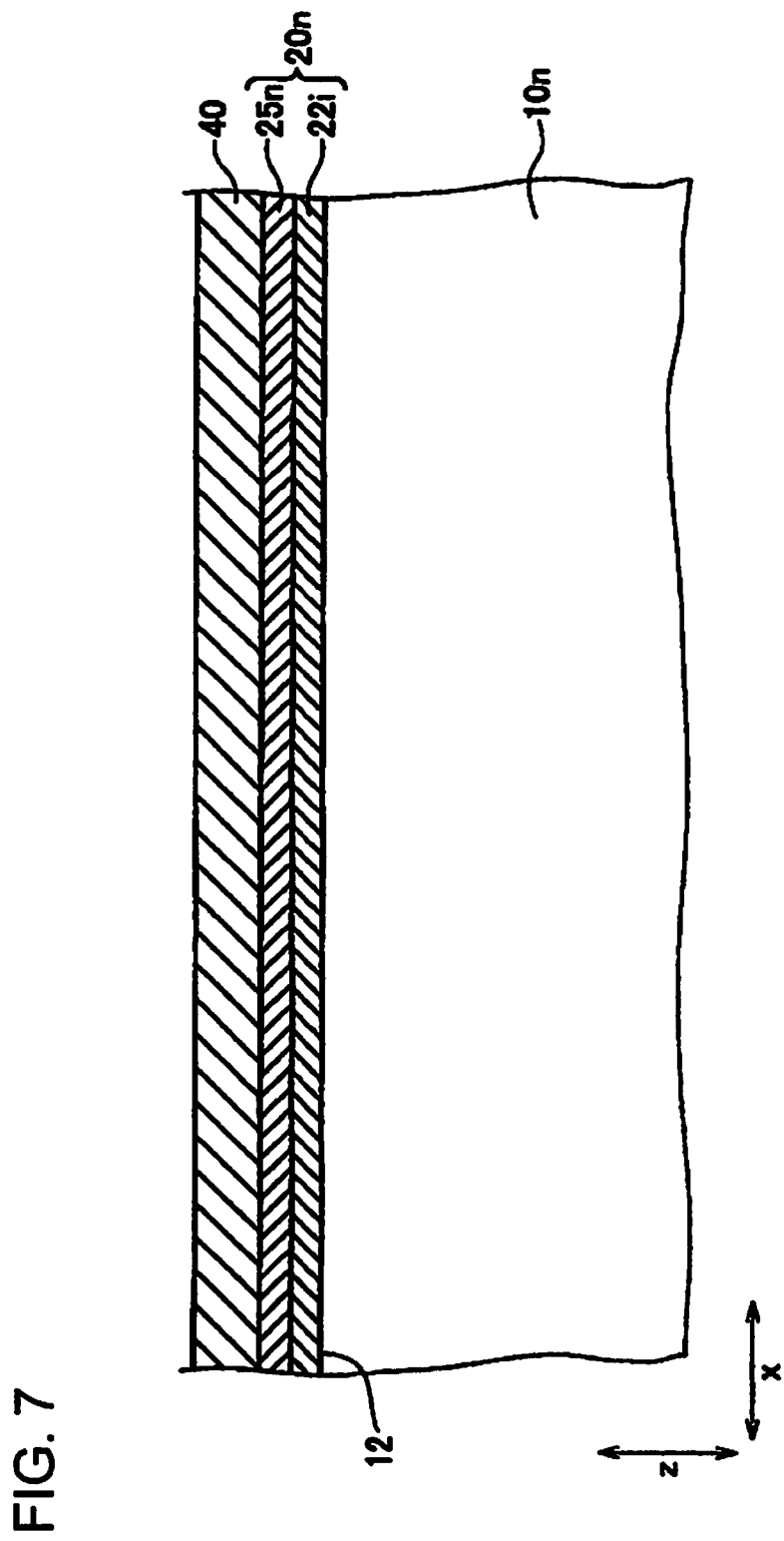
FIG. 7 is a drawing for illustrating the method of manufacturing solar cell 1A according to the embodiment.

Step S2 is a step of forming insulation layer 40 having an insulation property. With step S2, insulation layer 40 is formed on formed first semiconductor layer 20n. Specifically, as shown in FIG. 7, insulation layer 40 is formed on n-type amorphous semiconductor layer 25n. Insulation layer 40 is formed by, for example, the CVD method.

Step S3 is a step of forming trench 13 in rear surface of semiconductor substrate 10n. Step S3 includes steps S31 and S32.

Step S31 is a step of removing insulation layer 40 formed on first semiconductor layer 20n. An etching paste is applied onto insulation layer 40 by using the screen printing method. Seeing rear surface 12 from vertical direction z, the etching paste is applied onto an appropriate portion of insulation layer 40 on which second semiconductor layer 30p is formed. For this reason, width L1 and width L2 are determined depending on a width of the etching paste in arrangement direction x and a gap of the etching paste in arrangement direction x.

Figure 8:
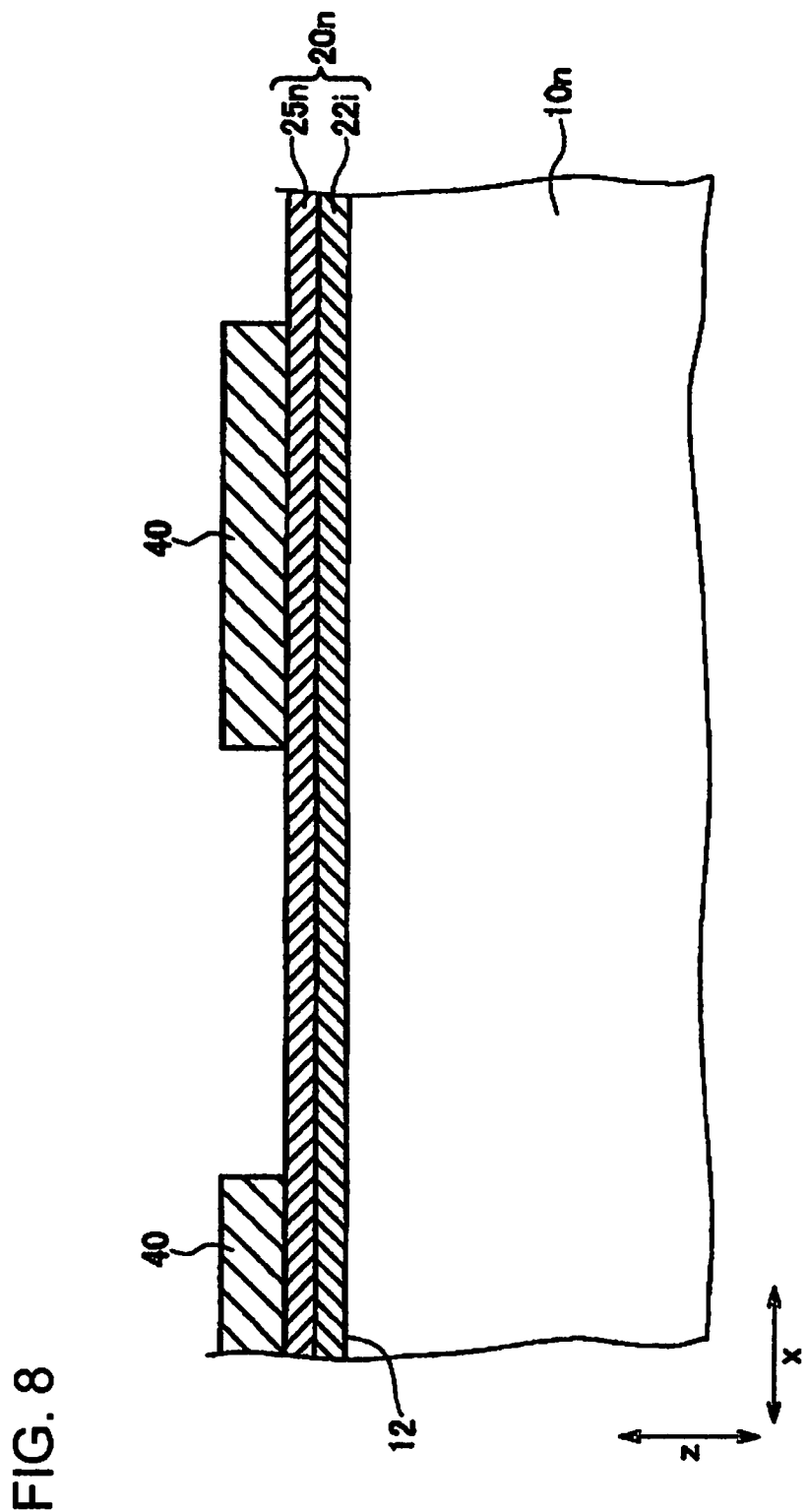
FIG. 8 is a drawing for illustrating the method of manufacturing solar cell 1A according to the embodiment.

After that, annealing is performed at 200° for approximately 4 minutes, and, as shown in FIG. 8, the portion of insulation layer 40 onto which the etching paste was applied is removed. Accordingly, first semiconductor layer 20n is exposed. In some processing condition, one portion of first semiconductor layer 20n is also removed.

Figure 9:
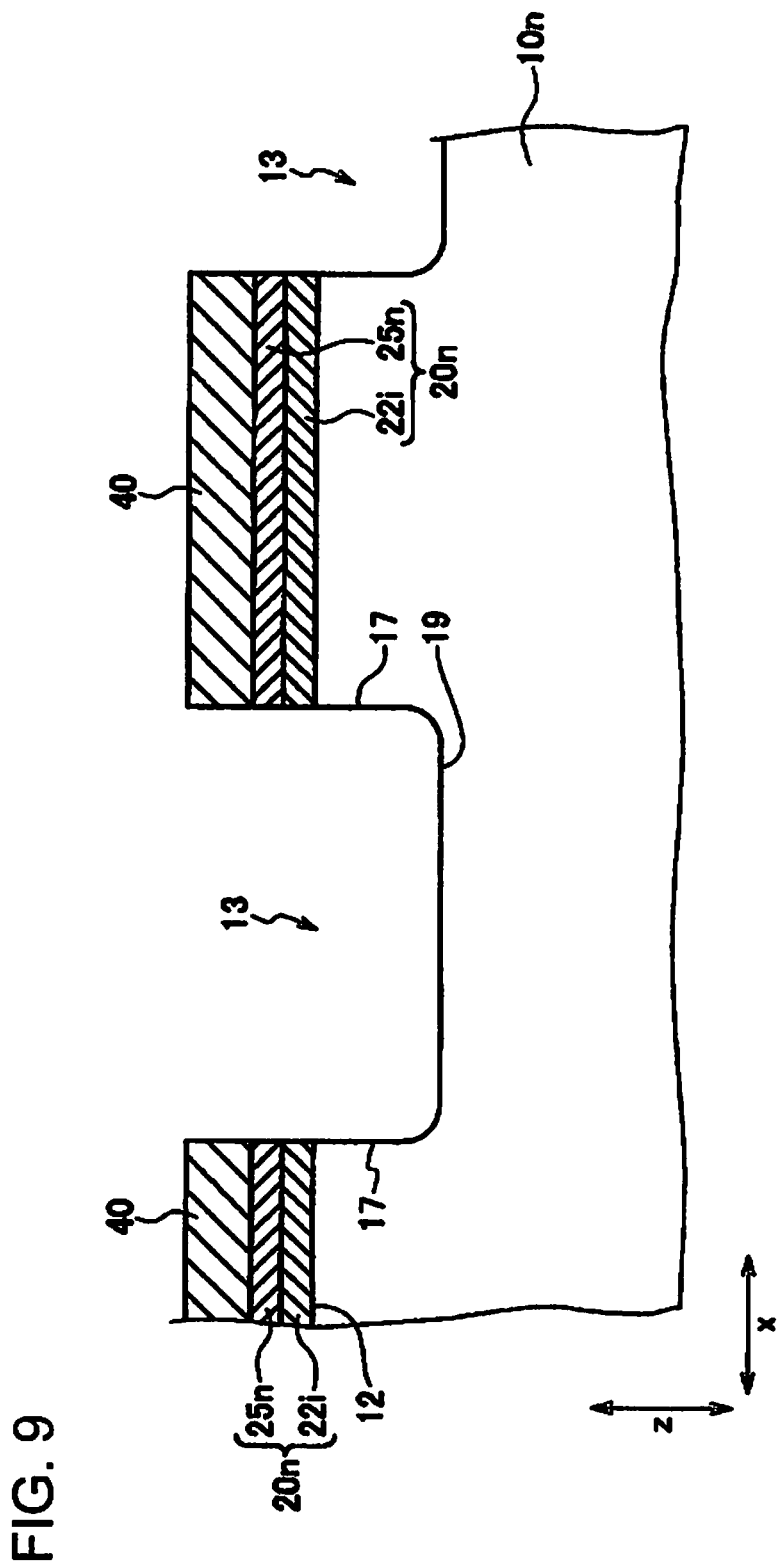
FIG. 9 is a drawing for illustrating the method of manufacturing solar cell 1A according to the embodiment.

Step S32 is a step of removing exposed first semiconductor layer 20n and forming trench 13 in rear surface 12 of semiconductor substrate 10n. Alkali cleaning is performed on exposed first semiconductor layer 20n. Accordingly, as shown in FIG. 9, first semiconductor substrate 20n is removed and trench 13 is formed in rear surface 12 of semiconductor substrate 10n. A depth of trench 13 is properly adjusted depending on the processing condition. At step S32, insulation layer 40 which is left residual without being removed serves as a protection layer to protect first semiconductor layer 20n. Note that trench 13 may be formed by other methods. For example, trench 13 may be formed by cutting.

Figure 10:
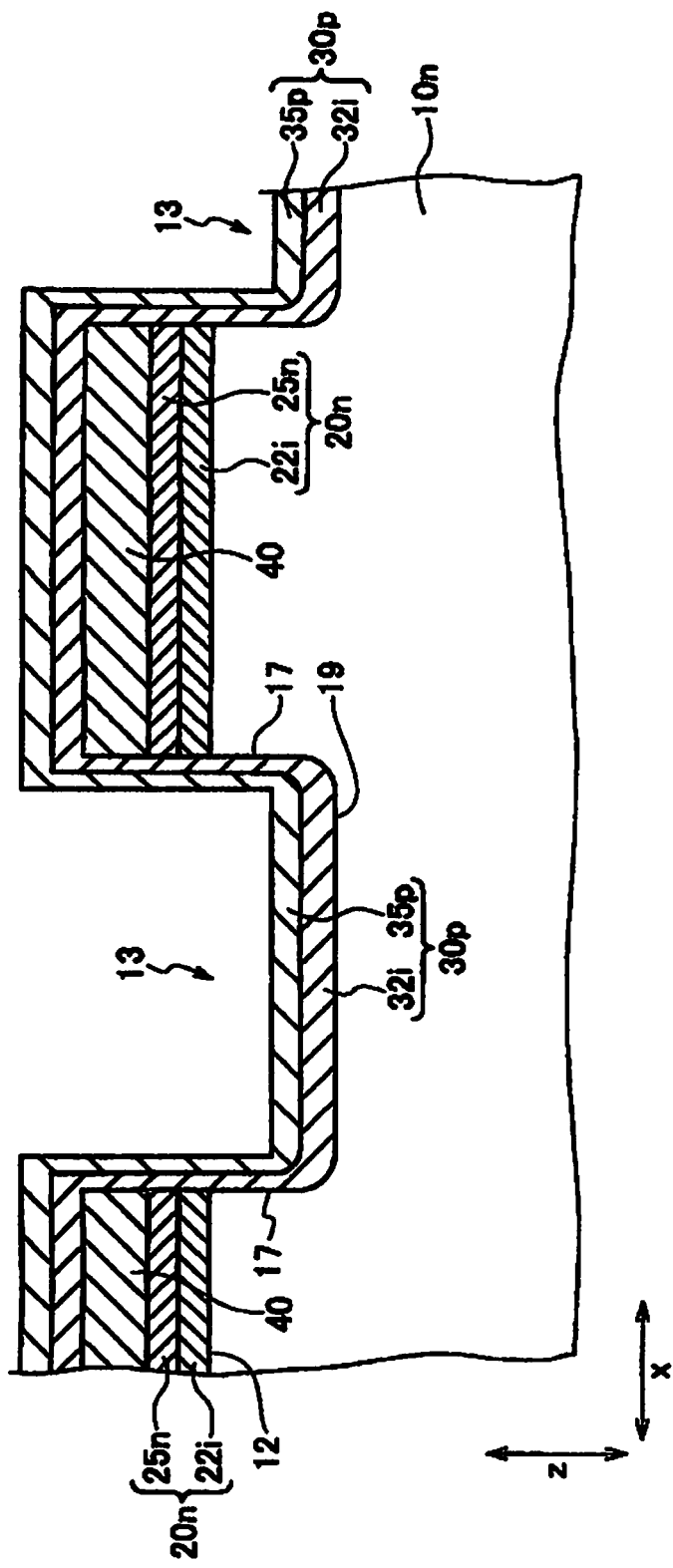
FIG. 10 is a drawing for illustrating the method of manufacturing solar cell 1A according to the embodiment.

Step S4 is a step of forming second semiconductor layer 30p in trench 13 formed in rear surface 12 of semiconductor substrate 10n. On rear surface 12 of semiconductor substrate 10n, i-type amorphous semiconductor layer 32i is formed. On formed i-type amorphous semiconductor layer 32i, p-type amorphous semiconductor layer 35p is formed. I-type amorphous semiconductor layer 32i and p-type amorphous semiconductor layer 35p are formed by, for example, the CVD method. With this step S4, second semiconductor layer 30p is formed on rear surface 12. In other words, second semiconductor layer 30p is formed on side surface 17 of trench 13 and bottom surface 19 of trench 13 in arrangement direction x. As shown in FIG. 10, in solar cell 1A, second semiconductor layer 30p is formed entirely. Accordingly, second semiconductor layer 30p is formed not only on rear surface 12 but also on insulation layer 40. Second semiconductor layer 30p coves an end portion of insulation layer 40 and an end portion of first semiconductor layer 20n. First semiconductor layer 20n and second semiconductor layer 30p are in contact with each other on a boundary between rear surface 12 in which trench 13 is not formed and trench 13. By performing step S32 after step S3 so as not to form trench 13, first semiconductor layer 20n and second semiconductor layer 30p are in contact with each other on rear surface 12 other than the boundary.

Step S5 is a step of forming first electrode 50n and second electrode 50p. Step S5 includes steps S51 to S54.

Figure 11:
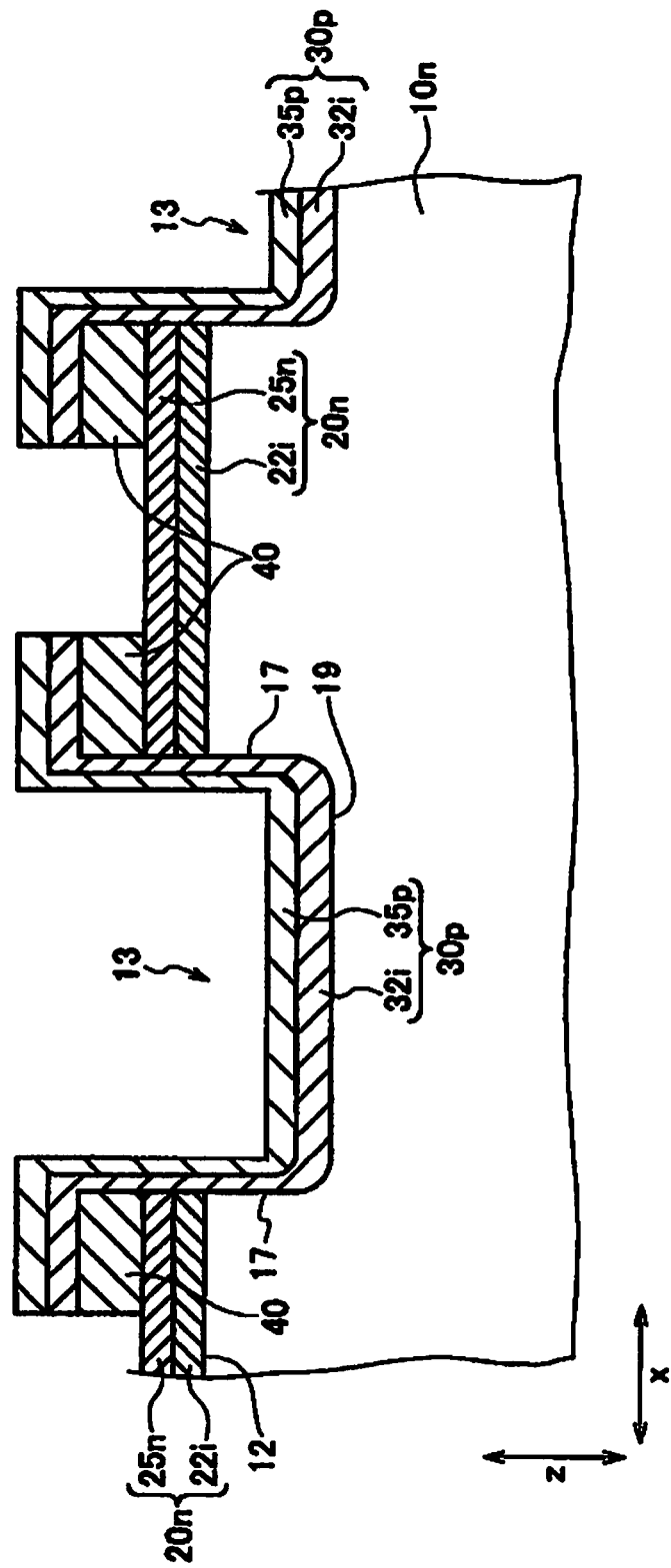
FIG. 11 is a drawing for illustrating the method of manufacturing solar cell 1A according to the embodiment.

Step S51 is a step of removing second semiconductor layer 30p and insulation layer 40. An etching paste is applied onto second semiconductor layer 30p formed on insulation layer 40 by using the screen printing method. After that, annealing is performed at approximately 70° for 5 minutes or so, and, then, as shown in FIG. 11, the portions of second semiconductor layer 30p and insulation layer 40 onto which the etching paste was applied are removed. If insulation layer 40 is left without being completely removed, insulation layer 40 is cleaned using hydrogen fluoride (HF). With this, first semiconductor layer 20n is exposed thereby forming an aperture. Second semiconductor layer 30p and insulation layer 40 may be removed separately, not simultaneously.

Figure 12:
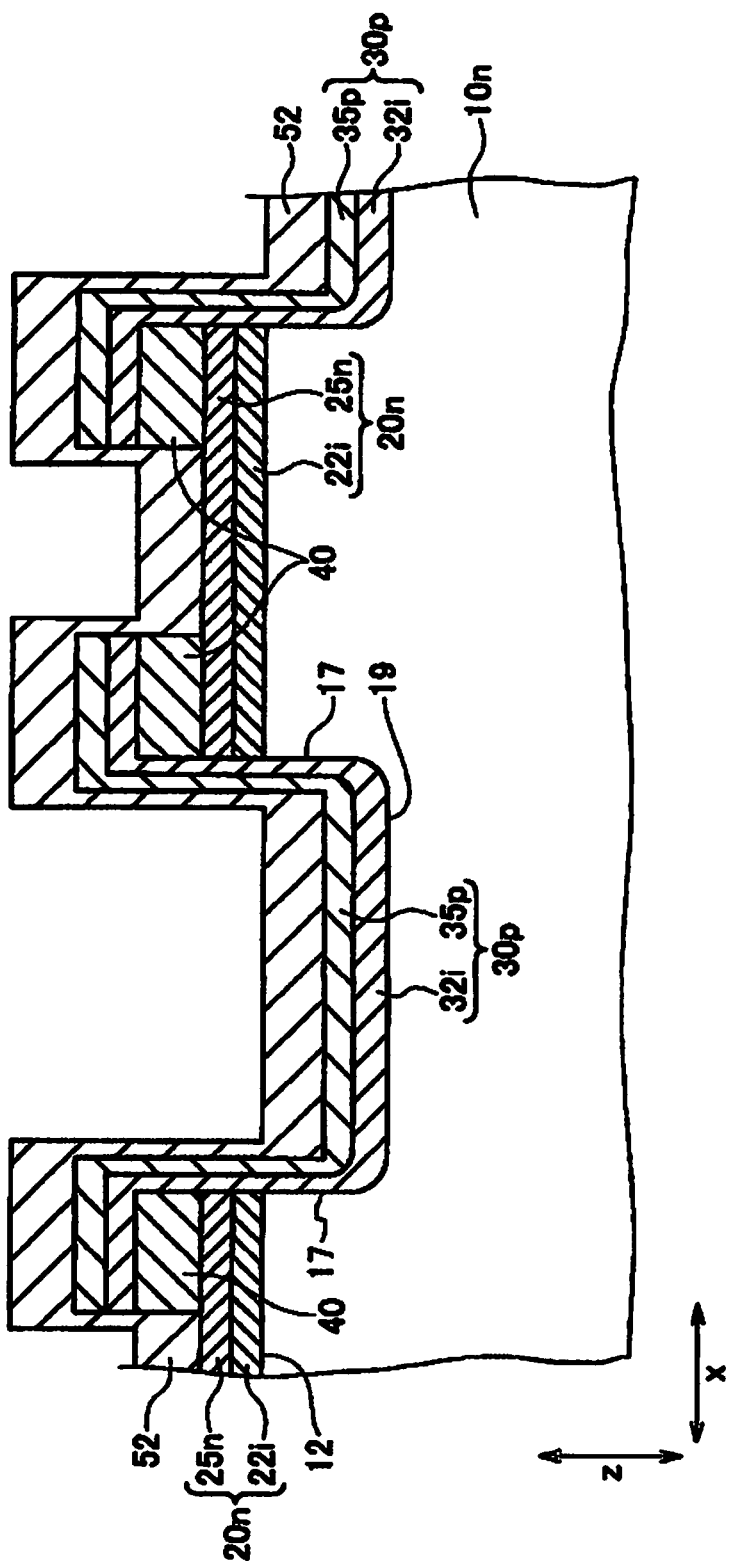
FIG. 12 is a drawing for illustrating the method of manufacturing solar cell 1A according to the embodiment.

Step S52 is a step of forming transparent electrode layer 52. As shown in FIG. 12, transparent electrode layer 52 is formed on first semiconductor layer 20n and second semiconductor layer 30p by using a physical vapor deposition method (PVD method). After that, an underlying metal layer (not shown) for plating to be an underlying layer of collection electrode 55 is formed by the PVD method. For the underlying metal layer, for example, Ni and Cu are used.

Figure 13:
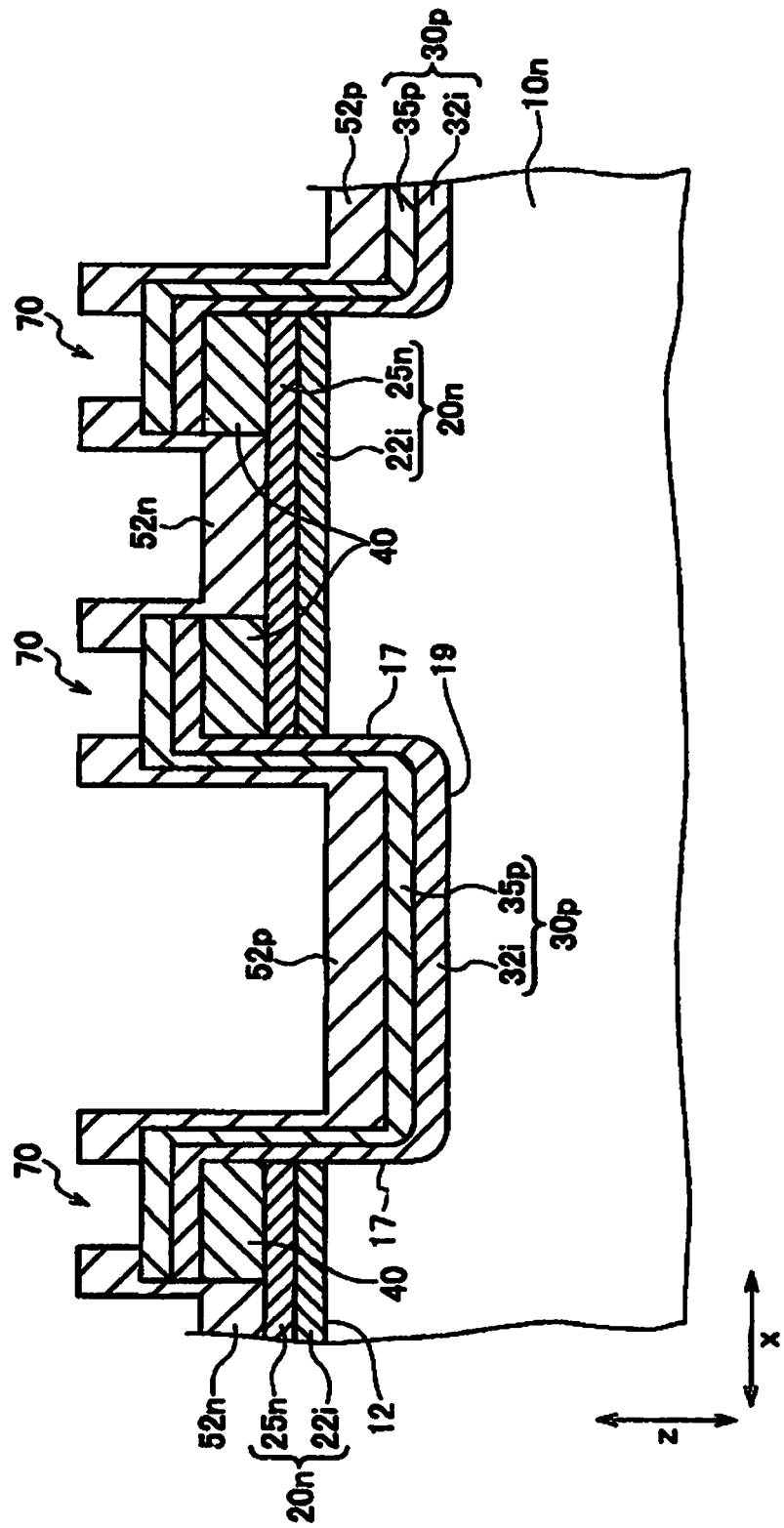
FIG. 13 is a drawing for illustrating the method of manufacturing solar cell 1A according to the embodiment.

Step S53 is a step of forming isolation trench 70 for preventing a short circuit. Isolation trench 70 is provided in transparent electrode 52 formed on second semiconductor layer 30p formed on insulation layer 40. An etching paste is applied onto the underlying metal layer by using the screen printing method. Annealing is performed at approximately 200° for 4 minutes or so, and, then, as shown in FIG. 13, the portion of the underlying metal layer onto which the etching paste was applied and the corresponding portion of transparent electrode 52 are removed. Accordingly, isolation trench 70 is formed. Note that, the patterning using a photo resist may be performed without using the etching paste in the step of forming isolation trench 70.

Step S54 is a step of forming collection electrode 55. Collection electrode 55 is formed in the underlying metal by using the plating method. Accordingly, first electrode 50n and second electrode 50p are formed. An end portion of first electrode 50n is connected to connection electrode 60n. An end portion of second electrode 50p is connected to connection electrode 60p. Consequently, solar cell 1A shown in FIG. 3 is formed.

Note that in a case where collection electrode 55 is formed in the underlying metal by using the plating method without forming isolation trench 70 in the underlying metal portion and transparent electrode 52, a step of separating collection electrode 55 into first electrode 50n and second electrode 50p. Since collection electrode 55 is thickly formed by the plating method, this method requires a longer time for separating collection electrode 55. Also, a material to be cut is increased, and thus a manufacturing cost is also increased. On the other hand, in the embodiment, isolation trench 70 is formed in the underlying metal and transparent electrode 52 at step S59 before collection electrode 55 is formed by using the plating method. Thus, first electrode 50n and second electrode 50p are isolated from each other by isolation trench 70. With this method, collection electrode 55 can be separated into first electrode 50n and second electrode 50p only by forming isolation trench 70 in the underlying metal thinner than collection electrode 55. Accordingly, a time required for the manufacturing step can be shortened.

(5) Comparative Evaluation

To ascertain the effects of the invention, a current density is evaluated by a computational model. Specifically, calculation is made on a current density of holes 80 moving to p-type second semiconductor layer 30p. Conditions for the computational model are as follows.

Figure 14A:
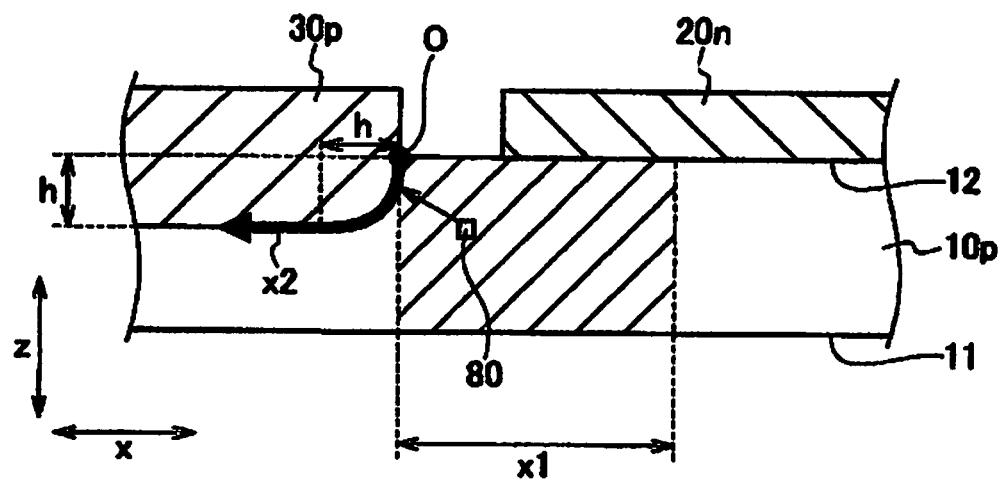
FIG. 14A is a cross-sectional view taken along vertical direction z vertical to arrangement direction x and longitudinal direction y and arrangement direction x of a solar cell according to an example in a computational model.
Figure 14B:
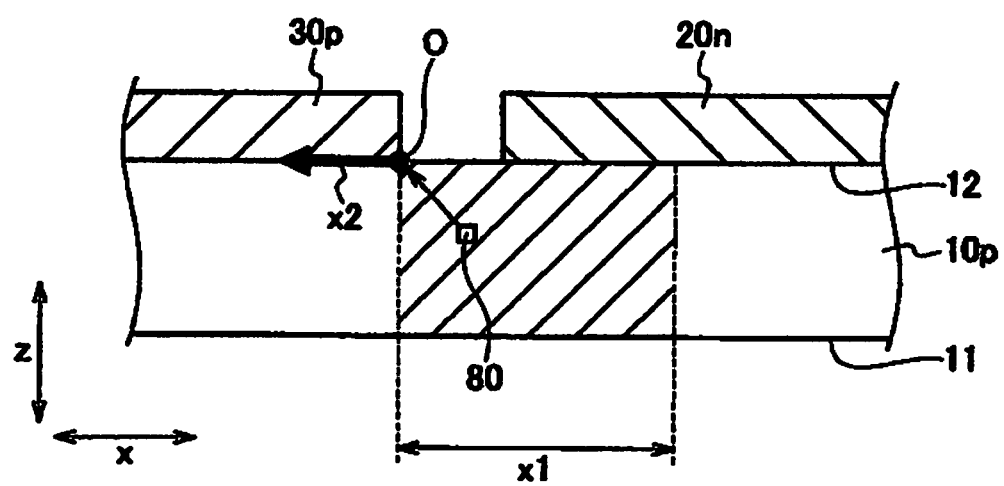
FIG. 14B is a cross-sectional view taken along vertical direction z vertical to arrangement direction x and longitudinal direction y and arrangement direction x of a solar cell according to a comparative example in the computational model.

P-type second semiconductor layer 30p is formed on rear surface 12 of n-type semiconductor substrate 10n with a thickness of 200 μm. As shown in FIGS. 14A and 14B, it is assumed that an end portion of second semiconductor layer 30p on rear surface 12 in arrangement direction x is set as origin O. In a region up to distance x1 from origin O toward first semiconductor layer 20n adjacent to the end portion of second semiconductor layer 30p, holes 80 generated in semiconductor substrate 10n by receiving light with light-receiving surface 11 are targeted. Distance x1 is 350 μm. It is assumed that a length in longitudinal direction y of semiconductor substrate 10n and second semiconductor layer 30p is infinite. Holes 80 are evenly generated within semiconductor substrate 10n. Holes 80 move to second semiconductor layer 30p via the shortest route. Holes 80 having arrived at second semiconductor layer 30p are collected at once.

FIG. 14A is a cross-sectional view taken along vertical direction z vertical to arrangement direction x and longitudinal direction y and arrangement direction x of a solar cell according to an example in the computational model. FIG. 14B is a cross-sectional view taken along vertical direction z vertical to arrangement direction x and longitudinal direction y and arrangement direction x of a solar cell according to a comparative example in the computational model. As shown in FIG. 14A, in the solar cell according to the example, a trench with depth h is formed in semiconductor substrate 10n. The trench is formed to have an arc shape with radius h from a side surface of the trench to the bottom surface of the trench in arrangement direction x. In example 1, depth h is 1 μm. In example 2, depth h is 5 μm. In example 3, depth h is 10 μm. In example 4, depth h is 20 μm. As shown in FIG. 14B, a trench is not formed in the solar cell according to the comparative example. The results of calculating the current densities using these solar cells are shown in FIG. 15.

Figure 15:
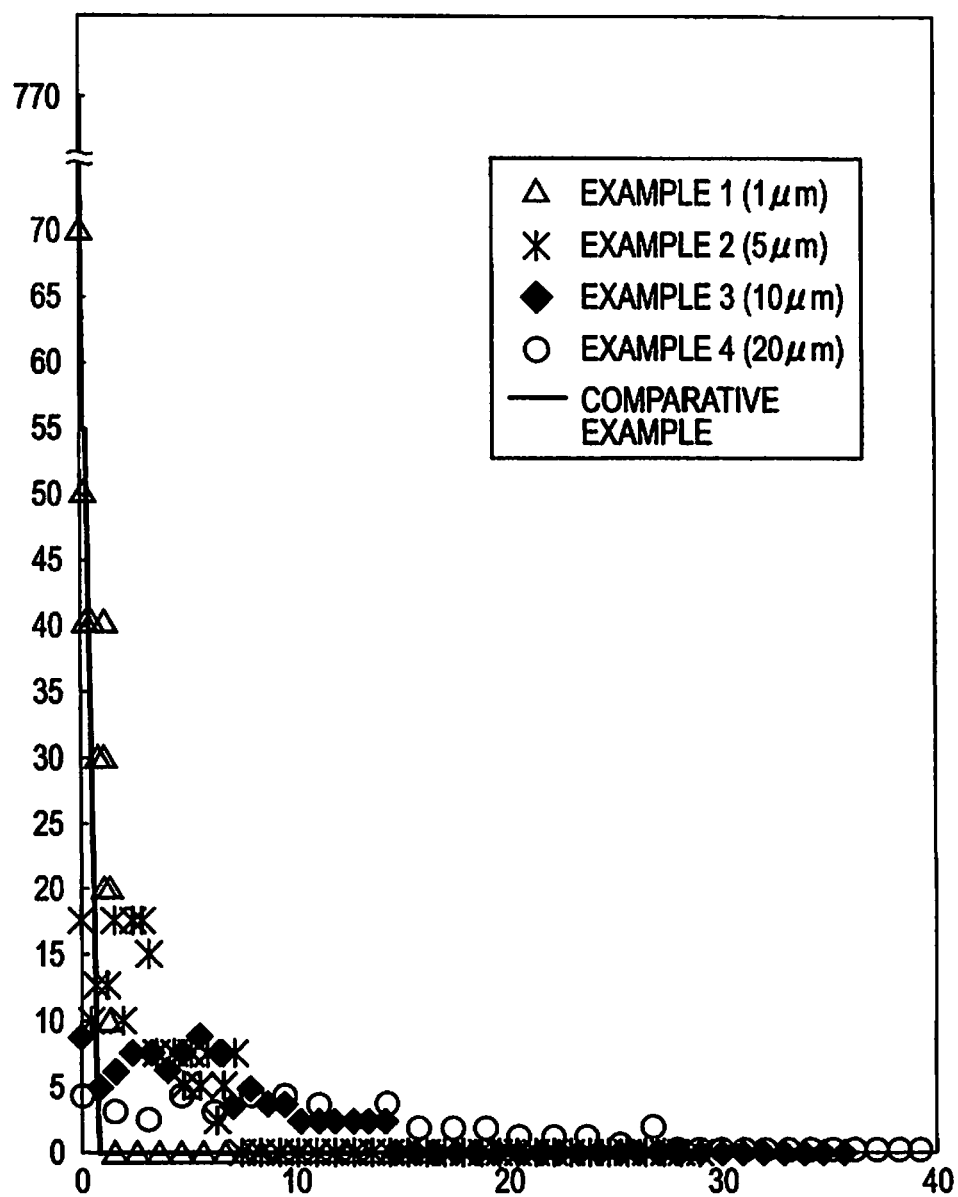
FIG. 15 is a graph showing a relationship between a relative current density and a distance from origin 0.

FIG. 15 is a graph showing a relationship between a relative current density and a distance from origin O. In FIG. 15, the vertical axis is a relative current density and the horizontal axis is a distance (μm) from origin O along direction x2. Direction x2 is a direction along rear surface 12 in arrangement direction x.

As shown in FIG. 15, in the comparative example, the relative current density is 770 at origin O. In a portion positioned 1 μm away from origin O, the relative current density is 0.2. This means that holes 80 are concentrated on the end portion of the rear surface of second semiconductor layer 30p.

On the other hand, as compared with the solar cell according to the comparative example, the current densities in origin O are greatly decreased in each of the solar cells according to the examples. Specifically, in example 1, the relative current density is 70 at origin O. In example 2, the relative current density is 18 at origin O. In example 3, the relative current density is 9 at origin O. In example 4, the relative current density is 4 at origin O. Also, it can be seen that holes 80 move to a more distant position as depth h is deeper.

It can be seen from these results that the current density can be further decreased as a junction surface between semiconductor substrate 10n and second semiconductor layer 30p is deeper.

(6) Operation and Effects

In a solar cell according to the embodiment, in solar cell 1A, second semiconductor layer 30p is formed on side surface 17 of trench 13 and bottom surface 19 of trench 13 in arrangement direction x. Accordingly, among carriers formed near first semiconductor layer 20n inside semiconductor substrate 10n, generated are carriers closer to second semiconductor layer 30p formed on side surface 17 and bottom surface 19 rather than the end portion of second semiconductor layer 30p on rear surface 12. For this reason, the carriers do not move in a concentrated manner to the end portion of second semiconductor layer 30n on rear surface 12 but also move to second semiconductor layer 30p formed on side surface 17 and bottom surface 19 in a dispersed manner. Accordingly, the current density is considered to be decreased. This can inhibit the time-related deterioration.

Furthermore, second semiconductor layer 30p is formed on side surface 17 of trench 13 and bottom surface 19 of trench 13, so that an area of the junction between semiconductor substrate 10n and second semiconductor layer 30p becomes wider. This can lower the series resistance. Thus, the fill factor of the solar cell can be improved.

In solar cell 1 according to the embodiment, side surface 17 is inclined to be continuous with bottom surface 19. Also, in solar cell 1 according to the embodiment, side surface 17 and bottom surface 19 may be continuous to form an arc shape. With this, among carries generated near first semiconductor layer 20n, further generated are carriers closer to second semiconductor layer 30p formed on side surface 17 and bottom surface 19, rather than the end portion of second semiconductor layer 30n on rear surface 12. As a result, the current density can be decreased, which can inhibit the time-related deterioration.

In solar cell 1 according to the embodiment, the junction between second semiconductor layer 30p and side surface 17 and the junction between second semiconductor layer 30p and bottom surface 19 are hetero-junctions. Different from a solar cell in which a junction is formed by dispersing dopant into a semiconductor substrate, the solar cell with the hetero-junction has a clear junction boundary. For this reason, the solar cell with the hetero-junction tends to have a larger current density. In solar cell 1, a portion in which the hetero-junction is formed is set to be on side surface 17 and bottom surface 19, so that the current density can be decreased.

In solar cell 1 according to the embodiment, semiconductor substrate 10n has a first conductivity type different from second semiconductor layer 30p having a second conductivity type. Accordingly, minority carriers move to second semiconductor layer 30p formed in trench 13. By forming trench 13, minority carriers moving to second semiconductor layer 30p via a shorter distance are generated. For this reason, the minority carriers to be re-coupled can be reduced.

In solar cell 1A according to the embodiment, width L2 of second semiconductor layer 30p formed on rear surface 12 in arrangement direction x is preferably longer than width L1 of first semiconductor layer 20n formed on rear surface 12 in arrangement direction x. This can lower the series resistance. Thus, the fill factor of the solar cell can be made smaller.

In solar cell 1B according to the embodiment, semiconductor substrate 10n has a conductivity type same as that of second semiconductor layer 30n. Also, width L2 of second semiconductor layer 30p formed on rear surface 12 in arrangement direction x is shorter than width L1 of first semiconductor layer 20n formed on rear surface 12 in arrangement direction x. With this, since width L2 is shorter, the moving distance of the minority carriers generated near bottom surface 19 can be shortened.

In solar cell 1 according to the embodiment, first semiconductor layer 20n and second semiconductor layer 30p are in contact with each other on rear surface 12. Also, first semiconductor layer 20n and second semiconductor layer 30p are in contact with each other on a boundary between rear surface 12 in which trench 13 is not formed and trench 13. With this, an area of the junction between the semiconductor substrate and the semiconductor layer can be maximized. Thus, the efficiency of generating electricity can be improved.

In this way, the solar cells of the embodiment decrease a current density and inhibit time-related deterioration in a back junction solar cell.

As described above, the contents of the invention are disclosed through the embodiment. However, it should not be understood that the description and drawings, which constitute one part of the invention, are to limit the invention. The invention includes various embodiments which are not described herein. Accordingly, the invention is only limited by the scope of claims and matters specifying the invention, which are appropriate from this disclosure.

What is claimed is:

1. A solar cell comprising:
a semiconductor substrate containing a crystalline semiconductor material and having a light-receiving surface and a rear surface;
a first amorphous semiconductor layer having a first conductivity type;
a second amorphous semiconductor layer having a second conductivity type, the first amorphous semiconductor layer and the second amorphous semiconductor layer being formed on the rear surface such that the first and second amorphous semiconductor layers are alternatively arranged in an arrangement direction on the rear surface, and
a trench formed in the rear surface, wherein
the first amorphous semiconductor layer is formed on an area of the rear surface in which the trench is not formed, thereby forming a first hetero-junction between the first amorphous semiconductor layer and the semiconductor substrate, and wherein a first transparent electrode layer and first collection electrode are formed on the first amorphous semiconductor layer,
the second amorphous semiconductor layer is formed inside of the trench, on a bottom surface of the trench and, on a side surface of the trench in the arrangement direction and wherein a second transparent electrode layer and second collection electrode are formed on the second amorphous semiconductor layer,
each of a second junction between the second amorphous semiconductor layer and the side surface and a third junction between the second amorphous semiconductor layer and the bottom surface is a heterojunction, and the bottom surface of the trench is closer, in a direction orthogonal to the rear surface of the semiconductor substrate, to the light-receiving surface of the semiconductor substrate than the area of the rear surface in which the trench is not formed and at which the first hetero-junction between the first amorphous semiconductor layer and the semiconductor substrate is formed, the side surface of the trench is inclined with respect to and is continuously connected with the bottom surface of the trench, a boundary of the side surface and the bottom surface forms an arc shape, and the second and third hetero-junctions are formed along the arc shape.

2. The solar cell according to claim 1, wherein the semiconductor substrate has the first conductivity type.

3. A solar cell comprising:

a semiconductor substrate containing a crystalline semiconductor material and having a light-receiving surface and a rear surface;

a first amorphous semiconductor layer having a first conductivity type;

a second amorphous semiconductor layer having a second conductivity type, the first amorphous semiconductor layer and the second amorphous semiconductor layer being formed on the rear surface such that the first and second amorphous semiconductor layers are alternatively arranged in an arrangement direction on the rear surface, and a trench formed in the rear surface, wherein the first amorphous semiconductor layer is formed on an area of the rear surface in which the trench is not formed, thereby forming a first hetero-junction between the first amorphous semiconductor layer and the semiconductor substrate, and wherein a first transparent electrode layer and first collection electrode are formed on the first amorphous semiconductor layer, the second amorphous semiconductor layer is formed inside of the trench, on a bottom surface of the trench, and on a side surface of the trench in the arrangement direction and wherein a second transparent electrode layer and second collection electrode are formed on the second amorphous semiconductor layer, each of a second junction between the second amorphous semiconductor layer and the side surface and a third junction between the second amorphous semiconductor layer and the bottom surface is a heterojunction, and the bottom surface of the trench is closer, in a direction orthogonal to the rear surface of the semiconductor substrate, to the light-receiving surface of the semiconductor substrate than the area of the rear surface in which the trench is not formed and at which the first hetero-junction between the first amorphous semiconductor layer and the semiconductor substrate is formed, the side surface of the trench is inclined with respect to and is continuously connected with the bottom surface of the trench, and a width of the second amorphous semiconductor layer formed on the rear surface in the arrangement direction is longer than a width of the first amorphous semiconductor layer formed on the rear surface in the arrangement direction.

4. The solar cell according to claim 1, wherein the semiconductor substrate has the second conductivity type, and a width of the second amorphous semiconductor layer formed on the rear surface in the arrangement direction is shorter than a width of the first amorphous semiconductor layer formed on the rear surface in the arrangement direction.

5. The solar cell according to claim 1, wherein the first amorphous semiconductor layer is in contact with the second amorphous semiconductor layer on the rear surface.

6. The solar cell according to claim 1, wherein the first amorphous semiconductor layer is in contact with the second amorphous semiconductor layer on a boundary between the area of the rear surface in which the trench is not formed and the trench.

7. A solar cell, comprising:

a semiconductor substrate containing a crystalline semiconductor material and having a light-receiving surface and a rear surface;

a first amorphous semiconductor layer formed on the rear surface of the semiconductor substrate;

an insulation layer formed on the first amorphous semiconductor layer and formed to include an aperture exposing the first amorphous semiconductor layer;

a second amorphous semiconductor layer arranged alternately in an arrangement direction with the first amorphous semiconductor layer on the rear surface of the semiconductor substrate and formed to cover the insulation layer;

an underlying electrode formed on the first amorphous semiconductor layer and the second amorphous semiconductor layer and formed to include an isolation trench on the insulation layer, the isolation trench electrically isolating the first amorphous semiconductor layer and the second semiconductor layer from each other;

a collection electrode formed on the underlying electrode; and a trench formed in the rear surface, wherein the first amorphous semiconductor layer is formed on an area of the rear surface in which the trench is not formed, thereby forming a first hetero-junction between the first amorphous semiconductor layer and the semiconductor substrate, the second amorphous semiconductor layer is formed inside of the trench, on a bottom surface of the trench, and on a side surface of the trench in the arrangement direction, each of a second junction between the second amorphous semiconductor layer and the side surface and a third junction between the second amorphous semiconductor layer and the bottom surface is a heterojunction, and the bottom surface of the trench is closer, in a direction orthogonal to the rear surface of the semiconductor substrate, to the light-receiving surface of the semiconductor substrate than the area of the rear surface in which the trench is not formed and at which the first hetero-junction between the first amorphous semiconductor layer and the semiconductor substrate is formed, the side surface of the trench is inclined with respect to and is continuously connected with the bottom surface of the trench, a boundary of the side surface and the bottom surface forms an arc shape, and the second and third hetero-junctions are formed along the arc shape.

8. The solar cell according to claim 7, wherein the second amorphous semiconductor layer is exposed at a bottom of the isolation trench.

9. The solar cell according to claim 8, wherein the first amorphous semiconductor layer and the second amorphous semiconductor layer are in contact with each other on a boundary between the rear surface in which the isolation trench is not formed and the trench.

10. The solar cell according to claim 7, wherein the first amorphous semiconductor layer has a p-type conductivity type and the second amorphous semiconductor layer has an n-type conductivity type.

11. The solar cell according to claim 1, wherein
- the first amorphous semiconductor layer is on the area of the rear surface in which no trench is provided such that the first amorphous semiconductor layer is flat without a convex and concave.

12. The solar cell according to claim 3, wherein
- the first amorphous semiconductor layer is on the area of the rear surface in which no trench is provided such that the first amorphous semiconductor layer is flat without a convex and concave.

13. The solar cell according to claim 7, wherein
- the first amorphous semiconductor layer is on the area of the rear surface in which no trench is provided such that the first amorphous semiconductor layer is flat without a convex and concave.

* * * * *